US009471286B2

(12) United States Patent
Yuen et al.

(10) Patent No.: US 9,471,286 B2
(45) Date of Patent: Oct. 18, 2016

(54) SYSTEM AND METHOD FOR PROVIDING CODE COMPLETION FEATURES FOR CODE MODULES

(71) Applicant: Microsoft Corporation, Redmond, WA (US)

(72) Inventors: Wai Man Yuen, Bellevue, WA (US); Vishal R. Joshi, Redmond, WA (US); Justin Beckwith, Bellevue, WA (US); Mikhail Arkhipov, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 204 days.

(21) Appl. No.: 13/909,758

(22) Filed: Jun. 4, 2013

(65) Prior Publication Data
US 2014/0359572 A1    Dec. 4, 2014

(51) Int. Cl.
*G06F 9/45* (2006.01)
*G06F 9/44* (2006.01)
*G06F 17/50* (2006.01)

(52) U.S. Cl.
CPC .............. *G06F 8/33* (2013.01); *G06F 8/423* (2013.01); *G06F 8/433* (2013.01); *G06F 8/35* (2013.01); *G06F 17/504* (2013.01)

(58) Field of Classification Search
CPC .......... G06F 11/3676; G06F 11/3476; G06F 11/348; G06F 11/362; G06F 11/3624; G06F 11/3604; G06F 11/3636; G06F 8/33; G06F 9/3851; G06F 21/14; G06F 21/125; G06F 21/562; G06F 8/313; G06F 8/41; G06F 8/443; G06F 17/30306; G06F 8/423; G06F 8/10; G06F 8/35; G06F 8/34; G06F 8/433; G06F 8/43; G06F 17/2247; G06F 17/30893; G06F 17/504
See application file for complete search history.

(56) References Cited

U.S. PATENT DOCUMENTS

| | | | | |
|---|---|---|---|---|
| 5,259,766 A | * | 11/1993 | Sack | G09B 19/0053 434/323 |
| 6,499,132 B1 | * | 12/2002 | Morley | G06F 17/504 714/38.13 |
| 6,799,718 B2 | * | 10/2004 | Chan | G06F 8/33 235/375 |

(Continued)

OTHER PUBLICATIONS

Max Schafer et al., Effective Smart Completion for JavaScript, IBM Research report, Mar. 6, 2013, [Retrieved on Sep. 16, 2014]. Retrieved from the internet: <URL: http://domino.watson.ibm.com/library/CyberDig.nsf/papers/E6A89D6E32BFA60385257B33006AB8F5/$File/rc25359.pdf> 12 Pages (1-11).*

(Continued)

*Primary Examiner* — Thuy Dao
*Assistant Examiner* — Anibal Rivera
(74) *Attorney, Agent, or Firm* — Ben Tabor; Micky Minhas

(57) ABSTRACT

Systems and methods are described for providing code completion features for code modules that have been incorporated into a source code document being edited by a user of a source code editor. Embodiment dynamically load and apply partial code evaluation to code modules referenced in the source code document (and any code modules referenced directly or indirectly by such code modules) while the user is editing it. The partial code evaluation is performed on a background thread that is separate from a main thread used to execute the user interface for the source code editor. The results of such partial code evaluation are cached and used to provide code completion information for the code modules.

20 Claims, 4 Drawing Sheets

(56) References Cited

U.S. PATENT DOCUMENTS

| | | | | |
|---|---|---|---|---|
| 7,127,707 | B1* | 10/2006 | Mishra | G06F 8/423 717/136 |
| 8,032,860 | B2* | 10/2011 | Piehler | G06F 17/21 717/110 |
| 8,239,823 | B2 | 8/2012 | Stenberg et al. | |
| 9,026,903 | B1* | 5/2015 | Michael | G06F 17/2247 715/235 |
| 9,229,691 | B2* | 1/2016 | Huang | G06F 8/33 |
| 2002/0016953 | A1* | 2/2002 | Sollich | G06F 8/33 717/100 |
| 2005/0015747 | A1* | 1/2005 | Zatloukal | G06F 8/33 717/109 |
| 2005/0114771 | A1* | 5/2005 | Piehler | G06F 17/21 715/264 |
| 2007/0277163 | A1* | 11/2007 | Avresky | G06F 8/43 717/140 |
| 2008/0201629 | A1* | 8/2008 | Duesterwald | G06F 11/3672 714/798 |
| 2008/0270981 | A1* | 10/2008 | Hutchison | G06F 8/33 717/110 |
| 2009/0013248 | A1* | 1/2009 | Hutchison | G06F 8/33 715/256 |
| 2009/0077091 | A1* | 3/2009 | Khen | G06F 8/34 |
| 2010/0083240 | A1* | 4/2010 | Siman | G06F 8/433 717/144 |
| 2010/0269095 | A1* | 10/2010 | King | G06F 8/41 717/111 |
| 2011/0258593 | A1 | 10/2011 | Ng et al. | |
| 2011/0295701 | A1* | 12/2011 | Phan | G06Q 30/0276 705/14.72 |
| 2012/0159441 | A1* | 6/2012 | Ghaisas | G06F 8/10 717/123 |
| 2012/0210243 | A1* | 8/2012 | Uhma | G06F 17/30893 715/744 |
| 2012/0246611 | A1* | 9/2012 | Sawant | G06F 8/35 717/104 |

OTHER PUBLICATIONS

Anh Tuan Nguyen et al., GraPacc: A Graph-Based Pattern-Oriented, Context-Sensitive Code Completion Tool, 2012 IEEE, [Retrieved on May 24, 2016]. Retrieved from the internet: <URL: http://delivery.acm.org/10.1145/2340000/2337431/p1407-nguyen.pdf> 4 Pages (1407-1410).*

Kyle I. Murray et al., Beyond Autocomplete: Automatic Function Definition, 2011 IEEE, [Retrieved on May 24, 2016]. Retrieved from the internet: <URL: http://ieeexplore.ieee.org/stamp/stamp.jsp?tp=&arnumber=6070421 > 2 Pages (259-260).*

Simonchik, Sergey, "Attaching the Sources of Node.js Core Modules",Retrieved at <<http://blog.jetbrains.com/webide/2012/03/attaching-the-sources-of-node-js-core-modules/>>, Mar. 26, 2012, pp. 4.

Price, Chris, "Making the most out of JavaScript Intellisense in VS2012", Retrieved at <<http://www.codeproject.com/Articles/460836/Making-the-most-out-of-JavaScript-Intellisense-in>>, Sep. 18, 2012, pp. 6.

Beckwith, Justin, "Node.js meet WebMatrix2", Retrieved at <<http://jbeckwith.com/2012/06/07/node-js-meet-webmatrix-2/>>, Jun. 7, 2012, pp. 12.

"Intellisense", Retrieved at <<http://www.anotherurl.com/library/intellisense.htm>>, Oct. 12, 2004, p. 3.

Ford, Alex, "Lets Talk Dynamic Languages", Retrieved at <<http://www.codetunnel.com/blog/post/lets-talk-dynamic-languages>>, Mar. 2013, pp. 4.

* cited by examiner

SYSTEM AND METHOD FOR PROVIDING CODE COMPLETION FEATURES FOR CODE MODULES

BACKGROUND

Software development environments exist that aid software developers in writing program code. A software development environment may include a source code editor for entering source code, one or more build automation tools, and a code debugger. Examples of commercially-available software development environments include Microsoft® WebMatrix® and Microsoft® Visual Studio®, provided by Microsoft Corporation of Redmond, Wash., JDeveloper® and NetBeans®, provided by Oracle Corporation of Redwood City, Calif., Adobe® Dreamweaver®, provided by Adobe Systems Inc. of San Jose, Calif., Eclipse IDE provided by Eclipse Foundation of Ontario, Canada, ActiveState® Komodo® provided by ActiveState Software Inc. of Vancouver, British Columbia, and IntelliJ® IDEA, provided by JetBrains, s.r.o., of Prague, Czech Republic.

Some conventional software development environments provide assistance to developers writing code by presenting what are known as code completion features. Code completion features are features that help developers learn more about the code they are using, keep track of parameters they are typing, and add calls to properties and methods with only a few keystrokes. For example, providing a code completion feature may involve automatically displaying a list of valid members from a type (or namespace) after a developer types a trigger character (for example, a period (.) in managed code or :: in C++) within a source code file. By interacting with an item within the list, a developer may cause the item to be automatically inserted into the source code file or may receive additional information about the item (e.g., a complete declaration for the item). Providing a code completion feature may also involve automatically providing a developer with information about the number, names, and types of parameters required by a method, or automatically completing the rest of a variable, command, or function name once a developer has entered enough characters to disambiguate the term. In Microsoft® WebMatrix® and Microsoft® Visual Studio®, the code completion features are referred to as IntelliSense®.

In providing code completion features, the degree of accuracy that can be achieved may depend on the type of programming language being used. For strongly typed languages such as Visual Basic and C#, providing accurate code completion information is relatively straightforward. For example, simple token-based analysis and/or static code analysis of the source code file may be used to provide highly-accurate code completion information for strongly typed programming languages. In contrast, it can be difficult to provide accurate code completion information for dynamic languages such as JavaScript, PHP, and Python, since these languages do not provide a consistent object model. For such dynamic programming languages, it can be difficult to correctly infer the shape and structure of variables, methods and the like, since these entities may be modified at runtime.

Programming platforms exist that enable developers to incorporate code modules that are stored in one or more support libraries into their source code files. For example, developers working in node.js—a popular server-side programming platform designed for writing scalable Internet applications—can incorporate the functionality of JavaScript code modules known as "node packaged modules" (also referred to herein as "node.js modules") by simply referencing such modules in their source code files. Using these modules can be painful for a developer because many source code editors do not provide functionality that shows the developer how to use the module application programming interface (API). Consequently, to determine how the module works, the developer must either try to find public documentation about the module or, if no such documentation exists, read the source code of the module itself.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the claimed subject matter is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

A method for providing code completion features for a source code document being edited by a user of a source code editor is described herein. In accordance with the method, a determination is made that code completion information is required for at least one code entity associated with a first code module referenced in the source code document. The first code module may comprise, for example, a code module written in a dynamic programming language such as a node.js module. In response to the determination, a number of steps are performed. In particular, module code is loaded. The module code includes code of the first code module. The module code may also include code of one or more additional code modules referenced directly or indirectly by the first code module. The module code is executed in a partial code evaluator to generate partial code evaluation results. The code completion information is derived from the partial code evaluation results. Then, the code completion information is provided to the user of the source code editor.

In accordance with the foregoing method, loading the module code may include determining a location of a file that stores at least a portion of the first code module based on rules associated with a runtime environment.

In further accordance with the foregoing method, executing the module code in the partial code evaluator may include building an abstract syntax tree based upon the module code and evaluating nodes of the abstract syntax tree in the partial code evaluator.

The foregoing method may further include caching the partial code evaluation results. For example, the partial code evaluation results may be cached in one or more of volatile and non-volatile memory. In accordance with such an embodiment, the step of deriving the code completion information may include deriving the code completion information from the cached partial code evaluation results. In further accordance with such an embodiment, the method may further include clearing the cached partial code evaluation results in response to determining that a file that stores at least a portion of the first code module has changed. In still further accordance with such an embodiment, the method may further include utilizing the cached partial code evaluation results to derive code completion information for a second source code document.

In one embodiment of the foregoing method, the step of executing the module code in the partial code evaluator is executed on a background thread that is separate from a main thread upon which an interface for the source code editor is executed.

In another embodiment of the foregoing method, the method further includes providing code completion information to the user of the source code editor that is based upon one or more default values rather than upon the partial code evaluation results while the module code is being executed in the partial code evaluator.

A computer program product is also described herein. The computer program product comprises a computer readable storage device having computer program logic recorded thereon for enabling a processing unit to provide code completion features for a source code document being edited by a user of a source code editor. The computer program logic includes first computer program logic and second computer program logic. When executed by the processing unit, the first computer program logic determines that code completion information is to be obtained for at least one code entity associated with a code module referenced in the source code document. The code module may comprise, for example, a code module written in a dynamic programming language such as a node.js module. When executed by the processing unit, the second computer program logic performs the following in response to the determination: loads partial code evaluation results obtained by pre-applying partial code evaluation to code of the code module, derives the code completion information from the partial code evaluation results, and provides the code completion information to the user of the source code editor.

A system is also described herein. The system includes one or more processors and a storage medium that stores computer program logic that is executable by the one or more processors. The computer program logic includes a code completion engine and a programming language engine. In response to a determination that code completion information is to be obtained for at least one code entity associated with a first code module referenced in the source code document, the programming language engine determines whether the first code module is a core module or a custom module. If the programming language engine determines that the first code module is a core module, then the programming language engine obtains from a module loader partial code evaluation results obtained by pre-applying partial code evaluation to code of the first code module, and derives the code completion information from the partial code evaluation results obtained by pre-applying partial code evaluation to code of the first code module. If the programming language engine determines that the first code module is a custom module, then the programming language engine obtains from the module loader module code, the module code including code of the first code module, executes the module code in a partial code evaluator to generate partial code evaluation results, and derives the code completion information from the partial code evaluation results obtained by executing the module code in the partial code evaluator. The code completion engine provides the code completion information to the user of the source code editor.

In one embodiment of the foregoing system, the first code module comprises a code module written in a dynamic programming language such as a node.js module.

In another embodiment of the foregoing system, the module code comprises code of the first code module and code of one or more additional code modules referenced directly or indirectly by the first code module.

In yet another embodiment of the foregoing system, the system also includes a cache that caches the partial code evaluation results obtained by executing the module code in the partial code evaluator.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use the invention.

Figure 1:
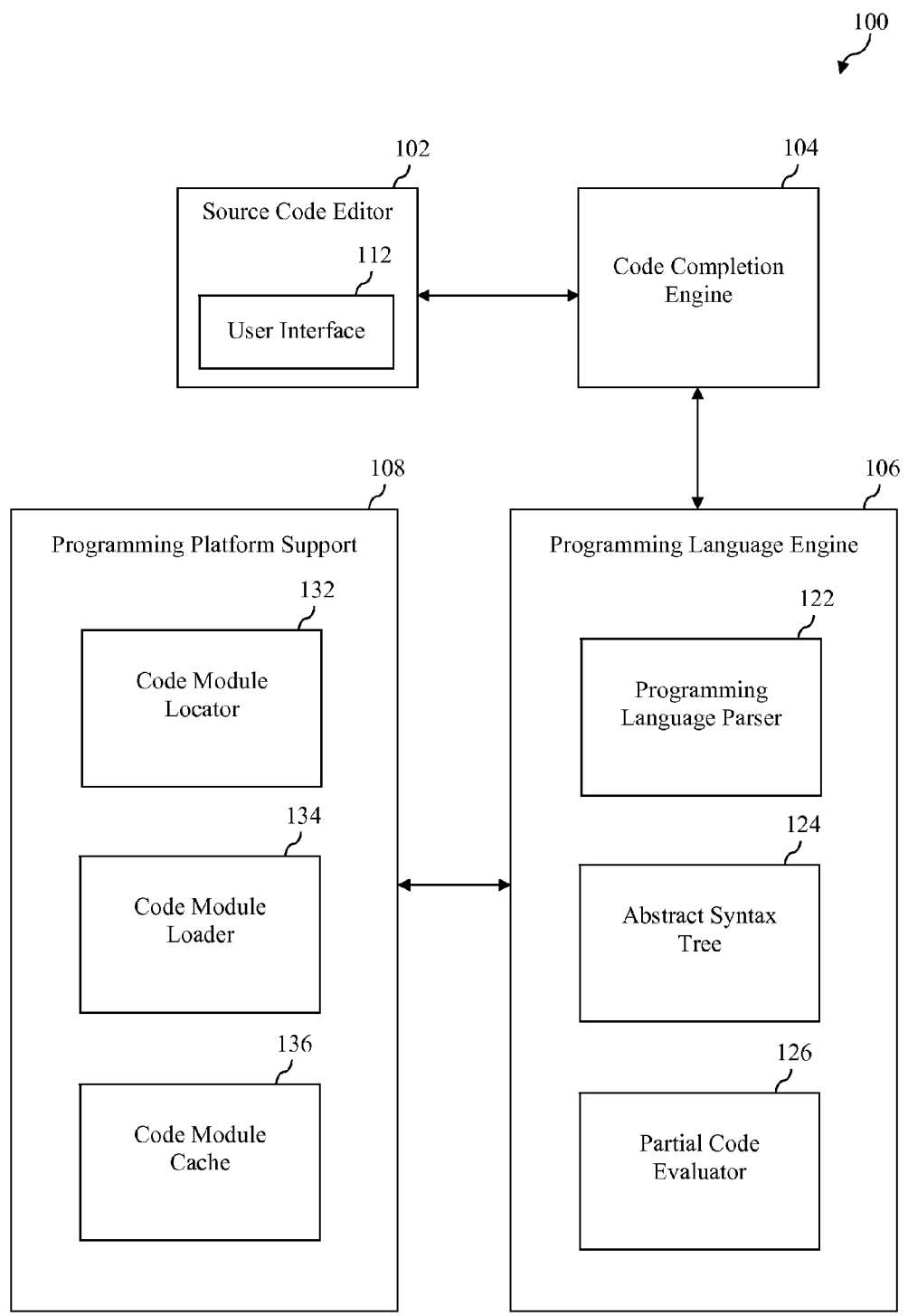
FIG. 1 is a block diagram of a system that provides code completion features for a code module referenced by a source code document in accordance with an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of persons skilled in the relevant art(s) to implement such feature, structure, or characteristic in connection with other embodiments whether or not explicitly described.

Embodiments described herein enable code completion features to be provided for code modules that have been incorporated into a source code document being edited by a user of a source code editor. Such code modules may include, for example, code modules programmed in a dynamic programming language such as JavaScript. In further accordance with this example, such code modules may include node.js modules associated with the popular node.js programming platform. However, this is an example only, and persons skilled in the relevant art(s) will readily appreciate that the techniques described herein may be used to provide code completion features for any type of code module incorporated into a source code document, including but not limited to code modules written in dynamically typed languages that are incorporated into source code documents.

As discussed above in the Background Section, using code modules such as node.js modules can be painful for a developer because many source code editors do not provide functionality that shows the developer how to use the module API. Embodiments described herein address this issue by providing an array of code completion features that can assist a developer in understanding code entities (e.g., methods and data members) associated with a code module that the developer has incorporated into his/her source code. As will be discussed herein, this is achieved, in part, by dynamically loading and analyzing code modules referenced in the source code document (and any code modules referenced directly or indirectly by such code modules) while the user is editing it.

As also discussed above in the Background Section, providing accurate code completion information for dynamic languages such as JavaScript can be difficult since such languages do not provide a consistent object model. Consequently, techniques such as token-based parsing and static code analysis may not be sufficient to correctly infer the shape and structure of dynamic programming language entities such as variables, methods and the like, since these entities may be modified at runtime. This issue arises when trying to provide code completion information for code modules programmed in a dynamic programming language such as JavaScript. As will be discussed herein, to address this issue, embodiments execute dynamically-loaded code modules in a partial code evaluator to obtain information about dynamic programming language entities that would otherwise only be available at runtime. The results of this partial code evaluation are then used to provide code completion information for the code modules.

It is desirable to provide code completion services in a manner that does not adversely impact the responsiveness of the source code editor. However, a code module may itself be very large and/or incorporate any number of other code modules, which themselves may be very large. Consequently, performing a partial code evaluation of the code module(s) referenced by a source code document may be a time-consuming and resource-intensive task. To ensure that this task is performed in a manner that does not significantly impact editor performance, embodiments described herein perform the partial code evaluation of code modules on a background thread that is separate from a main thread used to execute the user interface for the source code editor. Also, results generated by performing partial code evaluation on core modules are stored in a cache so that they can be re-used to obtain code completion information, thereby avoiding having to perform partial code evaluation on the same code module more than once. Such cached partial code evaluation results may also be used to derive code completion information for multiple source code documents being edited within the same or different or source code editors. Furthermore, for core code modules associated with a programming platform (e.g., core node.js modules), partial code evaluation results may be obtained offline, stored to disk, and then accessed to obtain code completion information when such core code modules are incorporated into a source code document, thereby reducing the number of code modules that must be dynamically-loaded and evaluated while the source code editor is running.

Some exemplary implementations will now be described to help illustrate the foregoing features. In particular, Section II, below, describes an example system for providing code completion features for a code module referenced by a source code document, as well as example methods for performing the same function. Section III, below, describes an example processor-based computer system that may be used to implement certain features described herein. Section IV provides some concluding remarks.

II. Example System and Methods for Providing Code Completion Features for a Code Module Referenced by a Source Code Document FIG. 1 depicts a block diagram of a system 100 that provides code completion features for a code module referenced by a source code document in accordance with an embodiment. It is noted that system 100 is described herein by way of example only. Persons skilled in the relevant art(s) will readily appreciate that the techniques described herein for providing code completion features for code modules referenced by source code documents may be implemented in a wide variety of systems other than system 100 of FIG. 1.

As shown in FIG. 1, system 100 includes a source code editor 102, a code completion engine 104, a programming language engine 106, and a number of components collectively designated programming platform support 108. In one embodiment, each of these components comprises software that is executed by the same processor-based computer system. One example of a processor-based computer system that may be used to execute these components is described in Section III below. In alternate embodiments, the components of system 100 may be distributed across two or more processor-based computer systems. In accordance with such an alternate embodiment, information may be shared between the different components using suitable interconnections or communication links as would be understood by persons skilled in the relevant art(s).

Source code editor 102 comprises a text editor that enables a user thereof to create and edit the source code of a computer program. To achieve this, source code editor includes a user interface 112. By interacting with user interface 112, a user of source code editor 102 can create a new source code document, open an existing source code document, edit a source code document, and save a source code document. After a user has created or opened a source code document, user interface 112 will accept text input by the user into the source code document and display such text within the context of the source code document.

Source code editor 102 is communicatively connected to code completion engine 104. Code completion engine 104 is configured to generate and present code completion information for a source code document currently being edited by a user of source code editor 102. Generally speaking, the code completion information comprises information about one or more programming language entities (also referred to herein as "code entities") that may be of interest to a user of source code editor 102. Such information is presented to the user while the user is inputting code into user interface 112 and may be presented in a variety of forms.

By way of example, the code completion information may be presented as part of a "list members" feature. The "list members" feature displays a list of valid member variables or functions for a particular class, struct, union or namespace after the user has typed a particular trigger character within the source code document. By interacting with a particular member from the list, a user may cause the member to be automatically inserted into the source code document or may receive additional information about the member.

As another example, the code completion information may be presented as part of a "parameter list" feature. The "parameter list" feature displays information about the number, names, and types of parameters required by a function or attribute. Such information may be displayed, for example, after the user types the name of the function or attribute followed by an open parenthesis.

As yet another example, the code completion information may be presented as part of a "quick info" feature. The "quick info" feature displays a complete declaration for a selected identifier within the source code document.

As still another example, the code completion information may be presented as part of a "complete word" feature. The "complete word" feature automatically inputs the rest of a variable, command, or function name into a source code document once a user has entered enough characters to disambiguate the term. If a number of variable, command or function names are potential matches, then a list of names will be presented to the user and the user may select one for input.

The foregoing code completion features are presented by way of example and are not intended to be limiting. Persons skilled in the relevant art(s) will appreciate that code completion engine 104 may provide other forms of code completion information other than those described above.

In an embodiment, code completion engine 104 is configured to provide code completion information for source code documents coded in a particular programming language. For example, code completion engine 104 may be configured to provide code completion information for source code documents coded in JavaScript. In accordance with such an embodiment, code completion engine 104 may comprise one of a plurality of code completion engines within system 100 and may be selectively invoked by source code editor 102 based upon the type of source code document that is being edited.

Generally speaking, code completion engine 104 generates code completion information by analyzing the contents of a source code document being edited by a user of source code editor 102 while the user is editing it. Such analysis may comprise a combination of a token-based analysis, static code analysis and an analysis based on partial code evaluation. Such code completion information may be generated automatically based on what a user has typed or in response to an explicit user request. Once the code completion information has been generated, it is provided to source code editor 102 for display to the user via user interface 112.

Partial code evaluation is utilized by code completion engine 104 to obtain information about dynamic programming language entities that might otherwise only be available at runtime. To enable such partial code evaluation, code completion engine 104 is communicatively coupled to programming language engine 106. Programming language engine 106 is configured to perform operations that are specific to a particular programming language. For example, in one embodiment, programming language engine 106 comprises a JavaScript engine that is configured to perform operations that are specific to a JavaScript programming language.

As shown in FIG. 1, programming language engine 106 comprises a programming language parser 122, an abstract syntax tree 124, and a partial code evaluator 126. Programming language parser 122 is configured to analyze the text of a source code document currently being edited within source code editor 102 to identify programming language entities included therein and to represent such programming language entities within a tree-like data structure, which is abstract syntax tree 124. For example, in an embodiment in which programming language engine 106 comprises a JavaScript engine, programming language parser 122 analyzes the text of a JavaScript document currently being edited within source code editor 102 to identify JavaScript entities included therein and to represent such JavaScript entities within abstract syntax tree 124.

Partial code evaluator 126 is configured to partially execute (or pseudo-execute) the code represented by abstract syntax tree 124 to obtain information about such code that would normally only be available at runtime. The results of the partial code evaluation are made accessible to code completion engine 104 and code completion engine 104 derives code completion information therefrom. In one embodiment, partial code evaluator 126 stores the partial code evaluation results within the nodes of abstract syntax tree 124.

It is possible that a user of source code editor 102 may incorporate a code module into a source code document that he/she is editing. Such code module may comprise a code module associated with a particular programming platform and may be stored in a support library associated with such programming platform. By way of example, a user of source code editor 102 may incorporate a node.js module that is associated with the node.js programming platform and that is stored in a node.js support library. Such node.js module may be incorporated, for example, by using the following JavaScript code:

var x=require ("everyauth");

Such code has the effect of incorporating the node.js module "everyauth" and making it accessible via the variable x. It is to be understood that the contents of the incorporated code module are not actually part of the source code document—rather, the contents of the incorporated code module will be linked to the code of the source code document at runtime by virtue of the statement of incorporation.

After incorporating the code module into the source code document, the user of source code editor 102 may want to input code that references one or more code entities within the incorporated code module. For example, the user of source code editor 102 may wish to reference a variable, command, or function from the incorporated code module within the source code document. Furthermore, the user of source code editor 102 may want to determine what parameters are required by a particular attribute or function from the incorporated code module, so that they can properly utilize such attribute or function in the source code document.

To assist the user in this regard, system 100 is configured to provide code completion information to the user about the code entities within the incorporated code module, even though the contents of such incorporated code module are not actually a part of the source code document being edited by the user. To achieve this, programming language engine 106 is configured to utilize functionality provided by the components of programming platform support 108 to dynamically load and apply partial code evaluation to code modules incorporated into the source code document (as well as code modules referenced directly or indirectly by such code modules) while the user is editing it. The results of the partial code evaluation of the code modules are then utilized by code completion engine 104 to derive code completion information therefrom.

In particular, when programming language engine 106 determines that a code module has been incorporated into the source code document being edited by the user and that code completion information is required for at least one code entity associated with the code module, then programming language engine 106 invokes a code module locator 132 to determine a location of one or more files that include the contents of the code module. After the location of the file(s) has been determined, a code module loader 134 is invoked to load the contents of the file(s) located by code module locator 132. After the module code is loaded, such module code is processed by programming language parser 122, which creates an abstract syntax tree representation of the module code. The abstract syntax tree representation of the module code is then passed to partial code evaluator 126, which performs partial code evaluation on the abstract tree representation of the module code, thereby producing partial code evaluation results. Partial code evaluator 126 then stores the partial code evaluation results in a code module cache 136, where they can be accessed by code completion engine 104 to derive code completion information for the code module. In one embodiment, storing the partial code evaluation results in code module cache 136 comprises storing the abstract syntax tree representation of the module code in code module cache 136 and then storing the partial code evaluation results in the nodes of the abstract syntax tree representation.

In one embodiment, programming language engine 106 invokes code module loader 132 to load not only the code of the incorporated code module but also the code of any code module referenced directly or indirectly by the incorporated code module. Such code may also be partially evaluated in the manner described above, and the partial evaluation results generated thereby may also be stored in code module cache 136.

In an embodiment, the partial code evaluation of the dynamically-loaded module code is performed in a background thread that is separate from a main thread that is used to execute user interface 112 of source code editor 102. This helps to ensure that such partial code evaluation will not significantly impact the performance of source code editor 102.

As noted above, results generated by performing partial code evaluation on the module code are stored in code module cache 136. These cached results can be used repeatedly by code completion engine 104 to obtain code completion information, thereby avoiding having to perform partial code evaluation on the same code module more than once. Such cached partial code evaluation results may also be used to derive code completion information for multiple source code documents being edited within source code editor 102 or within a different source code editor entirely.

In a further embodiment, for core code modules associated with a programming platform (e.g., core node.js modules), partial code evaluation results are obtained offline and stored to disk. When programming language engine 106 determines that code completion information is required for such core code module, it accesses the pre-evaluated results from disk and stores such results in code module cache 136. This has the beneficial effect of reducing the number of code modules that must be dynamically-loaded and evaluated while source code editor 102 is running.

Figure 2:
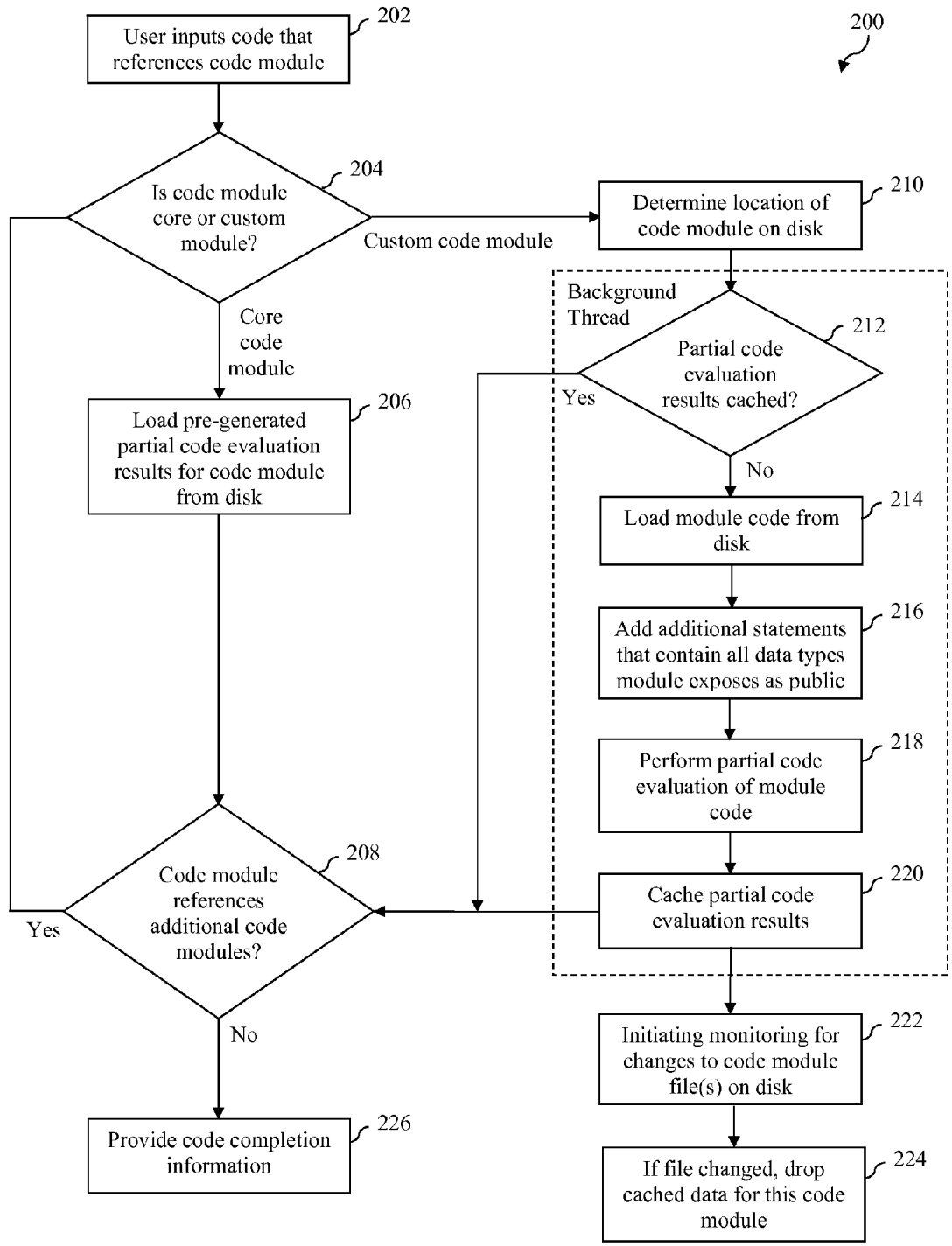
FIG. 2 depicts a flowchart of a method for providing code completion features for a code module referenced by a source code document in accordance with an embodiment.

The foregoing features of system 100 will now be further described with respect to FIG. 2. In particular, FIG. 2 depicts a flowchart 200 of a method for providing code completion features for a code module referenced by a source code document that may be implemented by system 100. Although the steps of flowchart 200 will be described with continued reference to the components of system 100 as described above in reference to FIG. 1, the method is not limited to that embodiment. Persons skilled in the relevant art(s) will appreciate that the method of flowchart 200 may be implemented using other components or systems entirely.

As shown in FIG. 2, the method of flowchart 200 begins at step 202 in which a user of source code editor 102 inputs code into a source code document that references a code module. By way of example, the user may type the following two lines of code:

var x=require ("everyauth");

x.

As discussed above, the first line of code has the effect of incorporating the node.js module "everyauth" and making it accessible via the variable x. The second line of code indicates that the user is referencing the variable x. The period following "x" comprises a trigger character that indicates that code completion information is required for variable x.

In decision step 204, in response to the user inputting code that references the code module, programming language engine 106 invokes code module locator 132, which determines whether the code module is a core module or a custom module. In one embodiment, determining whether the code module is a core module or a custom module comprises comparing the name of the code module to a list of core module names for a particular programming platform. If the name of the code module matches a name on the list, then the code module is determined to be a core module. Otherwise, the code module is determined to be a custom module. The list of core module names may be stored in non-volatile storage (e.g., a disk) that is locally accessible to code module locator 132 or may be retrieved from a remote computer via a suitable interconnection or communication link depending upon the implementation.

If it is determined during decision step 204 that the code module is a core code module, then control flows to step 206. During step 206, code module loader 134 is invoked to load pre-generated partial code evaluation results for the code module from disk. The pre-generated partial code evaluation results are obtained offline by pre-applying partial code evaluation to the code of the core code module. Such pre-generated partial code evaluation results are then stored in code module cache 136.

After step 206, control flows to decision step 208, in which programming language engine 106 determines whether the code module references additional code modules. If the code module does not reference any additional code modules, then control flows to step 226. During step 226, codes completion engine 104 derives code completion information for the code module from the partial evaluation results stored in code module cache 136 and presents such code completion information to the user of source code editor 102.

However, if programming language engine 106 determines during step 208 that the code module references additional code modules, then control flows back to decision step 204 so that each additional code module can be processed in the same manner as the original code module. In this way, every additional code module that is referenced directly or indirectly by the original code module will be processed by the method of flowchart 200.

Returning now to decision step 204, if code module locator 132 determines that the code module is a custom code module rather than a core code module, then control flows to step 210. During step 210, code module locator 132 determines the location of one or more files on disk that store the contents of the custom code module. This step may entail utilizing one or more rules that are utilized by a programming platform runtime to determine the location of the file(s). For example, in an embodiment in which the custom code module comprises a custom node.js module, this step may entail utilizing the same rules that are utilized by the node.js runtime to determine the location of the file(s) that includes the code of the custom node.js module.

After step 210, control flows to step decision step 212. During decision step 212, code module locator 132 determines if partial code evaluation results have already been cached for the custom code module in code module cache 136. If partial code evaluation results have already been cached, then control flows to decision step 208, the functionality of which has been previously described.

However, if code module locator 132 determines during decision step 212 that partial code evaluation results have not already been cached for the custom code module in code module cache 136, then control flows to step 214. During step 214, code module loader 134 is invoked to load into volatile memory the module code of the custom code from the disk location(s) identified during step 210. At step 216, programming language parser 122 modifies this module code to include additional statements that contain all data types that the custom code module exposes as public.

At step 218, programming language parser 122 parses the modified module code to generate an abstract syntax tree representation thereof. This abstract syntax tree representation of the module code is processed by partial code evaluator 126 to generate partial code evaluation results. At step 220, the partial code evaluation results generated during step 218 are cached by code module cache 136. As previously discussed, code completion engine 104 may use such cached partial code evaluation results to derive code completion information. In one embodiment, partial code evaluator 126 stores the partial code evaluation results within the nodes of the abstract syntax tree representation of the module code, which itself is stored within code module cache 136.

Depending upon the implementation, code module cache 136 may store the partial code evaluation results in volatile memory or non-volatile memory. If the partial code evaluation results are stored in volatile memory only, then it may be that such results may only be used to generate code completion information for source code documents being edited on the same machine upon which source code editor 102 is running while source code editor 102 is running. However, if the partial code evaluation results are stored in non-volatile memory, then it is possible that such partial code evaluation results may also be used to generate code completion information for source code documents being edited at a later time and/or on a different machine entirely.

As shown in FIG. 2, steps 212, 214, 216, 218 and 220 are performed on a background thread. Such background thread is intended to represent a thread that is different from a main thread that is used to execute user interface 112 of source code editor 102. As previously discussed, such an implementation advantageously minimizes the impact of such processing on the responsiveness of user interface 112.

After step 220, control flows to decision step 208, the functionality of which has been previously described. After step 220, control also flows to step 222. During step 222, code module cache 136 begins monitoring for changes to the file(s) on disk that store the contents of the custom code module that was evaluated in step 220. As shown at step 224, if code module cache 136 determines that changes have been made to the file(s), then code module cache 136 will clear the cached partial evaluation results for the custom code module. Code module cache 136 is programmed to behave in this manner to ensure that the cached partial evaluation results reflect the code that is actually stored in the custom code module file(s).

As shown in FIG. 2, the end result of the method of flowchart 200 is that code completion information is provided in step 226. It should be noted, however, that in certain embodiments, a "timeout" feature is implemented by system 100. In accordance with such a "timeout" feature, if it takes too long to perform the partial code evaluation necessary to generate the required code completion information, then code completion engine 104 will not provide code completion information to the user, or will provide only incomplete code completion information to the user. However, once the partial code evaluation of a code module has been initiated in the manner shown in FIG. 2, such partial code evaluation will nevertheless be completed in the background and the results generated thereby will be stored in code module cache 136 such that they will be available for future use.

Figure 3:
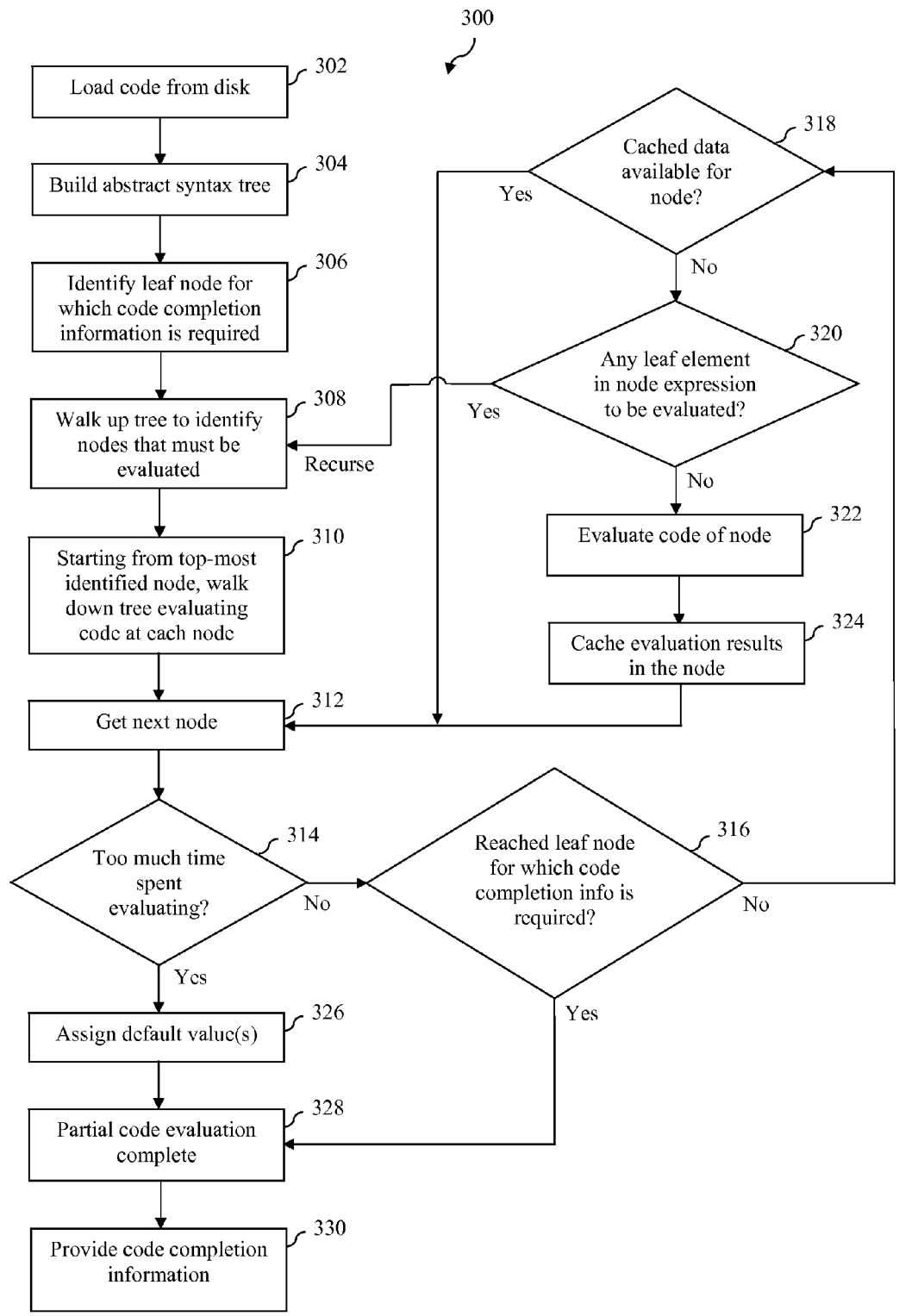
FIG. 3 depicts a flowchart of a method for performing partial code evaluation in accordance with an embodiment.

FIG. 3 depicts a flowchart 300 of a method for performing partial code evaluation in accordance with an embodiment. This description is provided herein by way of illustration only and is not intended to be limiting. The method shown in FIG. 3 may be used to perform partial code evaluation of the code within a source code document being edited by a user of source code editor 102 as well as to perform partial code evaluation of a code module incorporated into a source code document being edited by a user of source code editor 102. Although the steps of flowchart 300 will be described with continued reference to the components of system 100 as described above in reference to FIG. 1, the method is not limited to that embodiment. Persons skilled in the relevant art(s) will appreciate that the method of flowchart 300 may be implemented using other components or systems entirely.

As shown in FIG. 3, the method of flowchart begins at step 302, in which the code to which partial code evaluation is to be applied is loaded from disk. In the case in which the code comprises code from a custom code module, this step may be performed by code module loader 134.

At step 304, the code loaded during step 302 is parsed and an abstract syntax tree representation of the code is generated thereby. In an embodiment, this step is performed by programming language parser 122.

A description of steps 306, 308, 310, 312, 314, 316, 318, 320, 322, 324, 326 and 328 of flowchart 300 will now be provided. In an embodiment, each of these steps is performed by partial code evaluator 126.

At step 306, a leaf node for which code completion information is required is identified within the abstract syntax tree generated during step 304. At step 308, the abstract syntax tree is traversed upward from the leaf node identified during step 306 to identify each node of the tree that must be evaluated in order to properly evaluate the leaf node identified during step 306.

At step 310, starting from the top-most node identified during step 308, the abstract tree is traversed downward, evaluating the code at each node in a downward path to the leaf node identified during step 306. This process is shown as a loop beginning at step 312, in which the next node in the series of nodes to be evaluated is obtained.

From step 312, control flows to decision step 314. During decision step 314, it is determined whether too much time has been spent performing the partial code evaluation. This step may be performed, for example, by comparing an amount of time that has elapsed since beginning the partial code evaluation to a predetermined time limit. However, this example is not intended to be limiting, and other techniques may be used to determine whether too much time has been spent performing the partial code evaluation.

If it is determined during decision step 314 that too much time has been spent performing the partial code evaluation, then control flows to step 326. During step 326, one or more default values are assigned to the leaf node for which code completion information is required. For example, the default value(s) that are assigned may be determined based on a data type of a variable represented by the leaf node. In further accordance with this example, if the variable is an integer, a default value of 0 may be assigned. In still further accordance with this example, if the variable is a string, then one or more default methods for a string may be assigned.

After step 326, control flows to step 328 at which the partial code evaluation process is completed. After step 328, code completion information is provided based on the results of the partial evaluation process as shown at step 330. This step may be performed, for example, by code completion engine 104.

Returning now to decision step 314, if it is determined that too much time has not been spent performing the partial code evaluation, then control flows to decision step 316. If it is determined during decision step 316 that the leaf node for which code completion information is required has been reached then control flows to step 328, the functionality of which has already been described. However, if it is determined during decision step 316 that the leaf node for which code completion information is required has not been reached, then control flows to decision step 318.

During decision step 318, it is determined whether cached partial evaluation results are already available for the node that is currently being evaluated. If it is determined during decision step 318 that cached partial evaluation results are already available for the node that is currently being evaluated, then control flows to step 312, the functionality of which has already been described. However, if it is determined during decision step 318 that cached partial evaluation results are not already available for the node that is currently being evaluated, then control flows to decision step 320.

During decision step 320, it is determined if there are any leaf elements used in the expression represented by the node that is currently being evaluated that must be evaluated. If so, then control flows to step 308 and the process initiated there is performed in a recursive manner to evaluate such leaf element(s). However, if it is determined during decision step 320 that there are no leaf elements to be evaluated, then control flows to step 322.

At step 322, the code of the node is evaluated using partial code evaluation techniques. Such techniques may involve, for example, executing the code of the node in a manner that limits the amount of time spent evaluating such code. For example, if the code to be evaluated includes a loop with many iterations, only a few iterations of the loop may be executed in order to obtain results more quickly. Still other techniques may be used to limit the amount of time required to execute the code.

After step 322, the results of the partial code evaluation of the code performed during step 322 are cached in the node (i.e., as part of the abstract syntax tree data structure created during step 304), as shown at step 324. After step 324, control flows to step 312, the functionality of which has already been described.

It is noted that the foregoing functionality of flowchart 300 includes a "timeout" provision by way of decision step 314. However, as previously noted, in an embodiment the partial code evaluation of code modules, once initiated, is carried out in the background until such partial code evaluation is complete. In accordance with such an embodiment, when the method of flowchart 300 is applied to a code module, the time limit applied by decision step 314 may be assumed to be infinity (i.e., there is no time limit).

III. Example Processor-Based System Implementation

Figure 4:
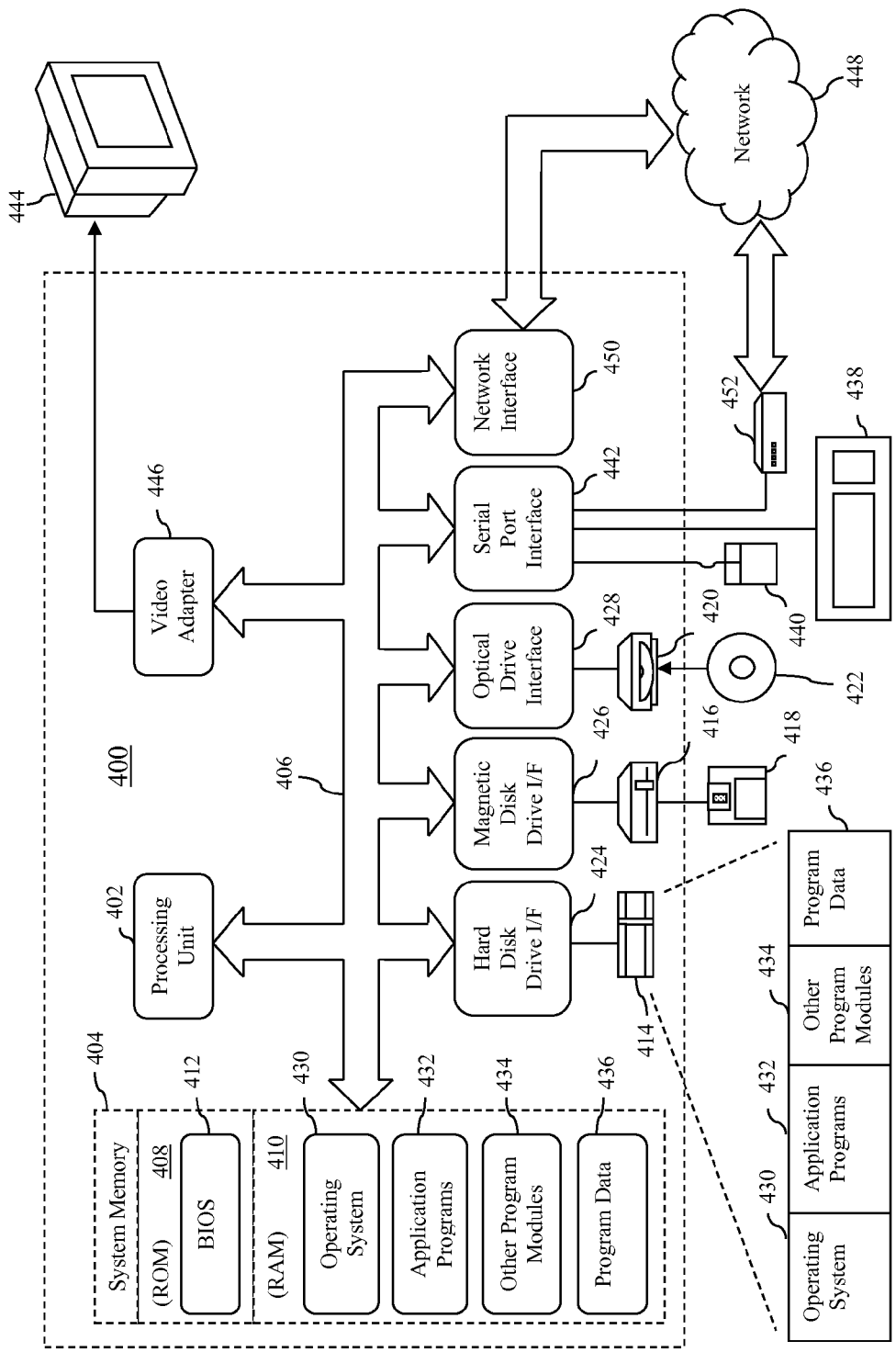
FIG. 4 is a block diagram of an example processor-based computer system that may be used to implement various embodiments.

FIG. 4 depicts an example processor-based computer system 400 that may be used to implement various embodiments described herein. For example, system 400 may be used to execute system 100 as described above in reference to FIG. 1, as well as any components thereof. The description of system 400 provided herein is provided for purposes of illustration, and is not intended to be limiting. Embodiments may be implemented in further types of computer systems, as would be known to persons skilled in the relevant art(s).

As shown in FIG. 4, system 400 includes a processing unit 402, a system memory 404, and a bus 406 that couples various system components including system memory 404 to processing unit 402. Processing unit 402 may comprise one or more processors or processing cores. Bus 406 represents one or more of any of several types of bus structures, including a memory bus or memory controller, a peripheral bus, an accelerated graphics port, and a processor or local bus using any of a variety of bus architectures. System memory 404 includes read only memory (ROM) 408 and random access memory (RAM) 410. A basic input/output system 412 (BIOS) is stored in ROM 408.

System 400 also has one or more of the following drives: a hard disk drive 414 for reading from and writing to a hard disk, a magnetic disk drive 416 for reading from or writing to a removable magnetic disk 418, and an optical disk drive 420 for reading from or writing to a removable optical disk 422 such as a CD ROM, DVD ROM, BLU-RAY™ disk or other optical media. Hard disk drive 414, magnetic disk drive 416, and optical disk drive 420 are connected to bus 406 by a hard disk drive interface 424, a magnetic disk drive interface 426, and an optical drive interface 428, respectively. The drives and their associated computer-readable media provide nonvolatile storage of computer-readable instructions, data structures, program modules and other data for the computer. Although a hard disk, a removable magnetic disk and a removable optical disk are described, other types of computer-readable storage devices and storage structures can be used to store data, such as flash memory cards, digital video disks, random access memories (RAMs), read only memories (ROM), and the like.

A number of program modules may be stored on the hard disk, magnetic disk, optical disk, ROM, or RAM. These program modules include an operating system 430, one or more application programs 432, other program modules 434, and program data 436. In accordance with various embodiments, the program modules may include computer program logic that is executable by processing unit 402 to perform any or all of the functions and features of system 100 as described above in reference to FIG. 1, as well as any components thereof. The program modules may also include computer program logic that, when executed by processing unit 402, performs any of the steps or operations shown or described in reference to flowchart 200 of FIG. 2 and flowchart 300 of FIG. 3.

A user may enter commands and information into system 400 through input devices such as a keyboard 438 and a pointing device 440. Other input devices (not shown) may include a microphone, joystick, game controller, scanner, or the like. In one embodiment, a touch screen is provided in conjunction with a display 444 to allow a user to provide user input via the application of a touch (as by a finger or stylus for example) to one or more points on the touch screen. These and other input devices are often connected to processing unit 402 through a serial port interface 442 that is coupled to bus 406, but may be connected by other interfaces, such as a parallel port, game port, or a universal serial bus (USB). Such interfaces may be wired or wireless interfaces.

A display 444 is also connected to bus 406 via an interface, such as a video adapter 446. In addition to display 444, system 400 may include other peripheral output devices (not shown) such as speakers and printers.

System 400 is connected to a network 448 (e.g., a local area network or wide area network such as the Internet) through a network interface or adapter 450, a modem 452, or other suitable means for establishing communications over the network. Modem 452, which may be internal or external, is connected to bus 406 via serial port interface 442.

As used herein, the terms "computer program medium," "computer-readable medium," and "computer-readable storage medium" are used to generally refer to storage devices or storage structures such as the hard disk associated with hard disk drive 414, removable magnetic disk 418, removable optical disk 422, as well as other storage device or storage structures such as flash memory cards, digital video disks, random access memories (RAMs), read only memories (ROM), and the like. Such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Embodiments are also directed to such communication media.

As noted above, computer programs and modules (including application programs 432 and other program modules 434) may be stored on the hard disk, magnetic disk, optical disk, ROM, or RAM. Such computer programs may also be received via network interface 450, serial port interface 442, or any other interface type. Such computer programs, when executed or loaded by an application, enable computer 400 to implement features of embodiments of the present invention discussed herein. Accordingly, such computer programs represent controllers of the computer 400.

Embodiments are also directed to computer program products comprising software stored on any computer useable medium. Such software, when executed in one or more data processing devices, causes a data processing device(s) to operate as described herein. Embodiments of the present invention employ any computer-useable or computer-readable medium, known now or in the future. Examples of computer-readable mediums include storage devices and storage structures such as RAM, hard drives, floppy disks, CD ROMs, DVD ROMs, zip disks, tapes, magnetic storage devices, optical storage devices, MEMs, nanotechnology-based storage devices, and the like.

In alternative implementations, system 100 may be implemented as hardware logic/electrical circuitry or firmware. In accordance with further embodiments, one or more of these components may be implemented in a system-on-chip (SoC). The SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

V. Conclusion

While various embodiments have been described above, it should be understood that they have been presented by way of example only, and not limitation. It will be apparent to persons skilled in the relevant art(s) that various changes in form and details can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for providing code completion features for a source code document being edited by a user of a source code editor, comprising:
    determining that code completion information is required for at least one code entity associated with a first code module referenced in the source code document; and
    in response to the determining step,
        loading module code, the module code including code of the first code module,
        executing the module code in a partial code evaluator to generate partial code evaluation results, executing the module code in the partial code evaluator including building an abstract syntax tree based upon the module code, identifying a leaf node of the abstract syntax tree for which the code completion information is required, traversing the abstract syntax tree upward from the identified leaf node to identify each node of the abstract syntax tree affecting evaluation of the identified leaf node, and evaluating the identified nodes of the abstract syntax tree,
        deriving the code completion information from the partial code evaluation results, and
        providing the code completion information to the user of the source code editor.

2. The method of claim 1, wherein the first code module comprises a code module written in a dynamic programming language.

3. The method of claim 2, wherein the first code module comprises a node.js module.

4. The method of claim 1, wherein loading the module code comprises:
    determining a location of a file that stores at least a portion of the first code module.

5. The method of claim 1, wherein the module code includes code of the first code module and code of one or more additional code modules referenced directly or indirectly by the first code module.

6. The method of claim 1, further comprising:
caching the partial code evaluation results;
wherein deriving the code completion information comprises deriving the code completion information from the cached partial code evaluation results.

7. The method of claim 6, wherein caching the partial code evaluation results comprises caching the partial code evaluation results in at least one of volatile memory and non-volatile memory.

8. The method of claim 6, further comprising:
clearing the cached partial code evaluation results in response to determining that a file that stores at least a portion of the first code module has changed.

9. The method of claim 6, further comprising:
utilizing the cached partial code evaluation results to derive code completion information for a second source code document.

10. The method of claim 1, wherein the step of executing the module code in the partial code evaluator is executed on a background thread that is separate from a main thread upon which an interface for the source code editor is executed.

11. The method of claim 1, further comprising:
while the module code is being executed in the partial code evaluator, providing code completion information to the user of the source code editor that is based upon one or more default values rather than upon the partial code evaluation results.

12. A computer program product comprising a computer readable storage device having computer program logic recorded thereon for enabling a processing unit to provide code completion features for a source code document being edited by a user of a source code editor, the computer program logic comprising:
first computer program logic that, when executed by the processing unit, determines that code completion information is to be obtained for at least one code entity associated with a code module referenced in the source code document; and
second computer program logic that, when executed by the processing unit, performs the following in response to the determination:
loads partial code evaluation results obtained by pre-applying partial code evaluation to code of the code module, the pre-applying of the partial code evaluation to code of the code module comprising identifying a leaf node of an abstract syntax tree representation of the code of the code module for which the code completion information is required and evaluating only nodes of the abstract syntax tree identified as affecting evaluation of the identified leaf node,
derives the code completion information from the partial code evaluation results, and
provides the code completion information to the user of the source code editor.

13. The computer program product of claim 12, wherein the code module comprises a code module written in a dynamic programming language.

14. The computer program product of claim 13, wherein the code module comprises a node.js module.

15. A system, comprising:
one or more processors; and
a storage medium that stores computer program logic that is executable by the one or more processors to provide code completion features for a source code document being edited by a user of a source code editor, the computer program logic comprising:
a programming language engine that, in response to a determination that code completion information is to be obtained for at least one code entity associated with a first code module referenced in the source code document:
determines whether the first code module is a core module or a custom module;
in response to determining that the first code module is a core module,
obtains from a module loader partial code evaluation results obtained by pre-applying partial code evaluation to code of the first code module, and
derives the code completion information from the partial code evaluation results obtained by pre-applying partial code evaluation to code of the first code module; and
in response to determining that the first code module is a custom module,
obtains from the module loader module code, the module code including code of the first code module,
executes the module code in a partial code evaluator to generate partial code evaluation results, executing the module code in the partial code evaluator including building an abstract syntax tree based upon the module code, identifying a leaf node of the abstract syntax tree for which the code completion information is required, traversing the abstract syntax tree upward from the identified leaf node to identify each node of the abstract syntax tree affecting evaluation of the identified leaf node, and evaluating the identified nodes of the abstract syntax tree; anderives the code completion information from the partial code evaluation results obtained by executing the module code in the partial code evaluator; and
a code completion engine that provides the code completion information to the user of the source code editor.

16. The system of claim 15, wherein the first code module comprises a code module written in a dynamic programming language.

17. The system of claim 16, wherein the code module comprises a node.js module.

18. The system of claim 15, wherein the module code comprises code of the first code module and code of one or more additional code modules referenced directly or indirectly by the first code module.

19. The system of claim 15, wherein the computer program logic further comprises:
a cache that caches the partial code evaluation results obtained by executing the module code in the partial code evaluator.

20. The system of claim 15, wherein the programming language engine is configured to execute the module code in the partial code evaluator on a background thread that is separate from a main thread upon which an interface for the source code editor is executed.

* * * * *